United States Patent [19]

Susei et al.

[11] 4,342,900
[45] Aug. 3, 1982

[54] VACUUM SHIELD DEVICE OF AN ELECTRON BEAM WELDING APPARATUS

[75] Inventors: Shuzo Susei; Shigetomo Matsui; Hiroyoshi Nagai, all of Kobe, Japan

[73] Assignee: Kawasaki Jukogyo Kabushiki Kaisha, Kobe, Japan

[21] Appl. No.: 93,943

[22] Filed: Nov. 13, 1979

[51] Int. Cl.³ .............................................. B23K 15/00
[52] U.S. Cl. ........................ 219/121 EN; 219/121 EC
[58] Field of Search ................. 219/121 EL, 121 EN, 219/121 EC, 121 ED, 121 EM, 121 EB

[56] References Cited

U.S. PATENT DOCUMENTS

| | | | |
|---|---|---|---|
| 3,301,993 | 1/1967 | Boyd et al. | 219/121 EN X |
| 3,601,248 | 8/1971 | Gerard | 219/121 EN X |
| 4,092,516 | 5/1978 | Martin | 219/121 EN |

Primary Examiner—C. L. Albritton
Attorney, Agent, or Firm—Jordan and Hamburg

[57] ABSTRACT

A vacuum shield device of an electron beam welding apparatus including a plate of a rectangular shape formed with a slit for allowing a beam of electrons to pass therethrough, a box-shaped member secured to the undersurface of the rectangular plate with its walls surrounding the slit, and a shield member secured to the outer periphery of the lower portions of the walls of the box-shaped member. The shield member includes a base formed of a heat-resisting and flexible material maintained in pressing engagement with the upper surface of the workpiece by pressing means. The force with which the pressing means forces the base against the workpiece is adjusted by pressure control means. The box-shaped member is formed with a cutout at the lower portion of either end wall.

8 Claims, 5 Drawing Figures

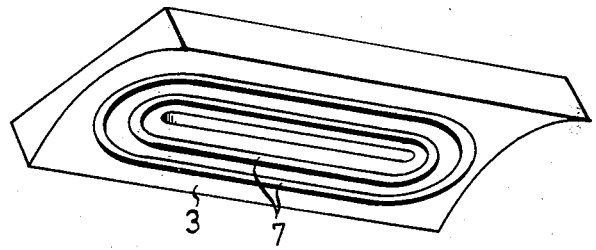
PRIOR ART FIG.3
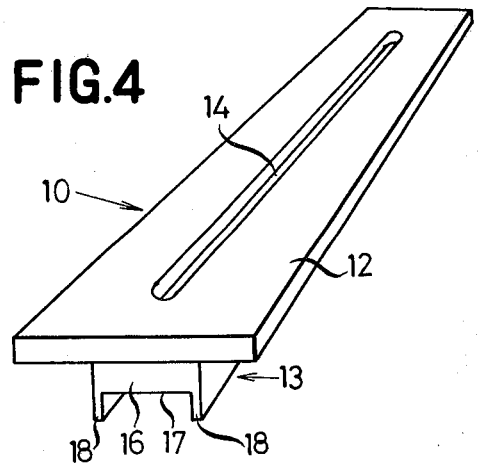
FIG.4
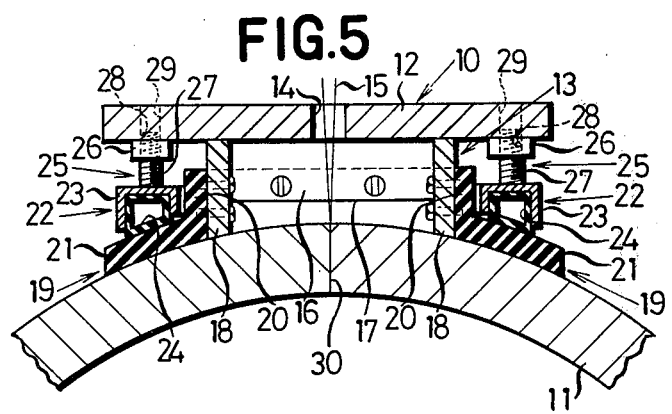
FIG.5

VACUUM SHIELD DEVICE OF AN ELECTRON BEAM WELDING APPARATUS

BACKGROUND OF THE INVENTION

This invention relates to a vacuum shield device of an electron beam welding apparatus.

Electron beam welding is an electric fusion welding process in which an electric current in the form of a stream of beam of electrons is used to melt a workpiece by impingement on it. Generally, electron beam welding is carried out in vacuum. Thus it is necessary when electron beam welding is carried out to place the portion of the workpiece to be joined by welding in an evacuated space. To this end, it is usual practice to place the whole of the workpiece in the vacuum chamber when electron beam welding is carried out. However, it is also known to use an electron beam welding apparatus of the type in which a portion of the workpiece to be joined by welding and its vicinity alone are placed in an evacuated space sealed by a vacuum shield device without using a vacuum chamber of large size. The electron beam welding apparatus of the type described includes a vacuum shield device located in the lower portion of the apparatus and brought into contact with the workpiece to carry out electric beam welding in vacuum. Generally, the vacuum shield device is constructed to have a flat undersurface. When the vacuum shield device having a flat undersurface is used for effecting butt welding on components having flat surfaces, it is possible to maintain the weld in vacuum by merely placing the device on the workpiece. However, when the workpiece has a surface which is not flat but convex, for example, as in a tubular member, a gap will be formed between the flat undersurface of the vacuum shield device and the convex surface of the workpiece to be welded, thereby making it impossible to maintain the weld in vacuum. In order to eliminate this trouble, it has hitherto been usual practice to use a vacuum shield spacer conforming in the shape of its undersurface to the shape of the workpiece to be welded which is connected to the bottom of the vacuum shield device to keep the weld in vacuum when electron beam welding is carried out. A single vacuum shield spacer could not serve the purpose of supplementing the vacuum shield device in handling all the types of workpiece of multifarious shapes. Thus it is necessary to have in reserve a large number of vacuum shield spacers of different shapes or fabricate a suitable spacer each time when the need arises. This not only increases the cost of the electron beam welding apparatus but also makes an electron beam welding operation a time-consuming process.

In order to point out the disadvantages of the prior art, one example of the vacuum shield device will be outlined by referring to FIGS. 1 to 3. In FIG. 1, the electron beam welding apparatus comprises a welding machine 1, a vacuum shield device 2 located below the welding machine 1, a vacuum shield spacer 3 located below the vacuum shield device 2, and a backing member 5 arranged on the back of a workpiece 4. The vacuum shield device 2 has a substantially planar undersurface and when the workpiece 4 is not planar at its surface but convex, as shown in FIG. 1, a gap will be formed between the convex surface of the workpiece 4 and the flat undersurface of the vacuum shield device 2 if the latter is placed on the former, thereby making it impossible to maintain a weld 6 of the workpiece 4 in vacuum. Thus it is necessary to interpose between the vacuum shield device 2 and the workpiece 4 the vacuum shield spacer 3 which conforms in the shape of its undersurface to the surface of the workpiece 4. As shown in FIGS. 2 and 3, the vacuum shield spacer 3 has O-rings 7 or other rings, not shown, formed of silicon rubber or other heat-resisting material provided on the undersurface thereof either singly or in combination. When in position, the O-rings 7 are forced against the surface of the workpiece 4 and suitably deformed. By the vacuum shield spacer 3 cooperating with the backing member 5, the weld 6 can be kept in vacuum while seam welding is being performed on the workpiece 4.

In the vacuum shield spacer 3 of the aforesaid construction, the spacer 3 can accommodate a change in the surface of the workpiece 4 only to the extent of the deformation of the O-rings 7. The range of dimensions of the workpiece 4 in which the vacuum shield spacer 3 can have application is small, and in actual practice it is necessary to prepare and have in reserve a large number of vacuum shield spacers 3 or to fabricate a new vacuum shield spacer 3 each time there is a change in the dimensions of the workpiece 4.

SUMMARY OF THE INVENTION

This invention obviates the aforesaid disadvantages of the prior art.

An object of the invention is to provide a vacuum shield device of an electron beam welding apparatus capable of use with workpieces having surface dimensions varying one from another.

Another object is to provide a vacuum shield device of the type described capable of not only accommodating changes of a great range in the diameter of workpieces but also handling workpieces of planar surface, thereby permitting the efficiency of an electron beam welding operation to be increased and the cost of the electron beam welding apparatus to be reduced.

A further object is to provide a vacuum shield device of the type described that can be used both as a device located below the welding machine and as a vacuum shield spacer arranged below the vacuum shield device.

According to the invention, there is provided, a vacuum shield device of an electron beam welding apparatus comprising a main body formed with an aperture for permitting a beam of electrons to pass therethrough and provided with legs spaced apart from each other, a shield member formed of flexible material joined to said main body and adapted to be brought into engagement with the surface of a workpiece, and pressing means for forcing said shield member against the surface of the workpiece.

Other objects and features of the present invention will be apparent in the description of the preferred embodiment.

BRIEF DESCRIPTION OF THE DRAWINGS

FIG. 3 is a perspective view of the vacuum shield spacer shown in FIG. 2;

FIG. 4 is a perspective view of the main body of the vacuum shield device comprising one embodiment of the invention; and FIG. 5 is a transverse sectional view of the vacuum shield device comprising the main body shown in FIG. 4.

DESCRIPTION OF THE PREFERRED EMBODIMENT

Figure 1:
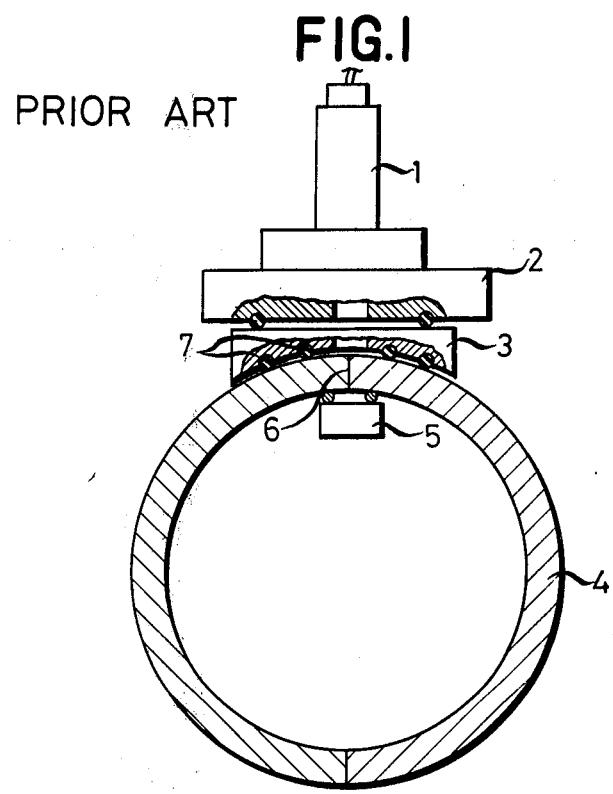
FIG. 1 is a front view with certain parts being cut out, of an electron beam welding apparatus of the prior art wherein the workpiece is partially kept in vacuum.
Figure 2:
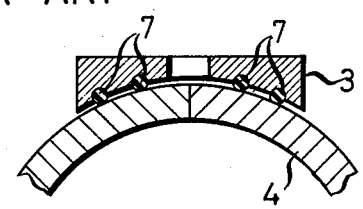
FIG. 2 is a sectional view of a vacuum shield spacer used with the electron beam welding apparatus shown in FIG. 1.

Referring to FIGS. 4 and 5, a main body 10 of the vacuum shield device adapted to be placed on the surface of a workpiece 11 includes a planar plate 12 of the rectangular shape, and a box-shaped member 13 formed unitarily with the plate 12 and joined to its undersurface. The plate 12 is formed with an aperture. In this embodiment, the aperture is in the form of a center axial slit 14 which extends along the length of the plate 12 to permit an electron beam 15 (FIG. 5) to pass therethrough. The box-shaped member 13 is positioned in such a manner that its walls surround the slit 14 without blocking same, and has a cutout 17 at the lower portion of either end wall 16 having a smaller length than side walls, so that legs 18 are formed in the lower portions of the side walls of larger length than the end walls 16 for contacting the surface of the workpiece 11.

As can be clearly seen in FIGS. 4 and 5, the box-shaped member 13 is smaller in width and length than the plate 12, and an endless shield member 19 of substantially L-shaped construction in cross section is fitted airtight around the entire periphery of the lower portions of the walls of the box-shaped member 13. The shield member 19 includes a riser 20 and a base 21, the riser 20 being secured to the outer wall surfaces of the box-shaped member in airtight relation. As the shield member 19 is secured to the box-shaped member 13, the base 21 can be brought into pressing engagement with the surface of the workpiece 11. The shield member 19 is formed of heat-resisting and flexible material, such as silicon rubber. The riser 20 of the shield member 19 may be formed of stiff material while the base 21 alone is formed of heat-resisting and flexible material.

Pressing means 22 for forcing the base 21 against the surface of the workpiece 11 located on the surface of the base 21 of the shield member 19. The pressing means 22 of this embodiment includes a keep member 23 of substantially inverted U-shaped construction in cross section located on and extending along the endless base 21 of the shield member 19, and a hose member 24 arranged inwardly of and partially covered by the keep member 23 to be kept in place by the keep member 23. The hose member 24 receives a supply of a pressure medium, such as compressed air, from an air compressor, not shown, so that the hose member 24 will force the base 21 of the shield member 19 against the surface of the workpiece 11 with the force of the pressure medium in the hose member 24.

Pressure control means 25 for controlling the force with which the pressing means 22 forces the base 21 of the shield member 19 against the surface of the workpiece 11 is located above the pressing means 22. In this embodiment, the pressure control means 25 comprises a plurality of nuts 26 and bolts 27. The nuts 26 are each secured to a portion of the undersurface of the plate 12 disposed outside the walls of the box-shaped member 13. The bolts 27 each threaded into a threaded opening 28 of one of the nuts 28 and a threaded opening 29 formed in the plate 12, so that each bolt 27 abuts at its forward end on the surface of the keep member 23. By turning the bolts 27, it is possible to adjust the force with which the pressing means 22 forces the base 21 of the shield member 19 against the surface of the workpiece 11. The pressure control means 25 comprising the bolts 27 and nuts 26 may be replaced by other pressure control means, such as hydraulic means, which effects adjustments by hydraulic pressure of the force with which the pressing means 22 forces the base 21 of the shield member 19 against the surface of the workpiece 11.

When the vacuum shield device shown in FIG. 5 is used as a vacuum shield spacer, the plate 12 of the shield device has an electron beam welding machine, not shown in FIG. 5, placed thereon with the shield device 2 shown in FIG. 1 being interposed between the welding machine and the plate 12. When the vacuum shield device shown in FIG. 5 is not used as a vacuum shield spacer but used as a vacuum shield device, the electron beam welding machine is directly placed on the upper surface of the plate 12.

The manner in which the vacuum shield device shown in FIGS. 4 and 5 is set for operation will now be described. The vacuum shield device is placed on the workpiece 11 in such a manner that the electron beam 15 emitted from the electron beam welding machine impinges on an axially extending linear portion 30 of the workpiece 11 after passing through the slit 14. The surface of the workpiece 11 is convex in shape. However, since the opposite end walls 16 of the box-shaped member 13 are formed with the cutouts 17 at the lower portions to accommodate the upper surface of the workpiece 11, the legs 18 at the opposite side walls of the box-shaped member 13 can be brought into abutting engagement with the upper surface of the workpiece 11 in such a manner that the base 21 of the shield member 19 is brought into intimate contact with the upper surface of the workpiece 11.

Then compressed air is supplied to the hose member 24 of the pressing means 22. With the bolts 27 abutting at their forward ends on the upper surface of the keep member 23 surrounding the hose member 24, the hose member 24 receiving the supply of compressed air can force the base 21 of the shield member 19 against the upper surface of the workpiece 11 with a strong force. This brings the base 21 formed of flexible material into conformity with the shape of the outer surface of the workpiece 11 and kept in intimate contact therewith, thereby ensuring an airtight seal between the outer surface of the workpiece 11 and the base 21.

When the workpiece 11 is a tubular member as shown in FIG. 5, it is possible to set the force exerted by the hose member 24 on the base 21 of the shield member 19 at an optimum level in accordance with the radius of curvature of the surface of the workpiece 11 by turning the bolts 27. Thus even if the workpiece 11 shows a variation in the radius of curvature, it is possible to provide the aforesaid airtight seal by the same vacuum shield device 10 so long as the variation is not so great.

The electron beam welding machine is placed on the upper surface of the plate 12 in airtight relation, either alone or in combination with the vacuum shield device 2 shown in FIG. 1, and backing means, not shown in FIG. 5, is arranged on the back of the workpiece 11 along the seam welding line 30 (See FIG. 1). Thereafter the box-shaped member 13 is evacuated to maintain its interior in vacuum, to carry out electron beam welding.

From the foregoing description, it will be appreciated that according to the invention the shield member of flexible material is forced against the surface of the workpiece to provide a shield to the vacuum in the interior of the boxed-shaped member 13, so that it is possible to attain the end by using the same vacuum shield device even if the workpieces in tubular form show variations of a considerably great range in the radius of curvature or even if the workpieces have a planar surface. Thus the invention eliminates the need to have in reserve a large number of vacuum shield spacers for use with workpieces of different sizes, thereby increasing the efficiency with which welding is carried out and reducing the cost of production of the electron beam welding apparatus.

What is claimed is:

1. A vacuum shield device of an electron beam welding apparatus comprising a main body formed with an aperture for permitting a beam of electrons to pass therethrough and provided with legs spaced apart from each other, a shield member formed of flexible material joined to said main body and adapted to be brought into engagement with the surface of a workpiece, and pressing means contiguous with said shield member for forcing said shield member against the surface of the workpiece.

2. A vacuum shield device as claimed in claim 1, wherein said shield member comprises a riser secured to the legs of the main body, and a base formed integrally with the riser and adapted to engage the surface of the workpiece, at least said base of said riser and said base of said shield member being formed of flexible material, said base of said shield member being forced by said pressing means against the surface of the workpiece.

3. A vacuum shield device as claimed in claim 1 or 2, wherein said main body includes a plate having said aperture formed therein, and a box-shaped member joined to the undersurface of said plate and surrounding said aperture by walls, and wherein said shield member is formed endlessly and secured to the entire periphery of the lower portion of the walls of said box-shaped member.

4. A vacuum shield device as claimed in claim 3, wherein said box-shaped member includes two sidewalls and two end walls, said legs of said main body are formed in lower portions of the two side walls of said box-shaped member extending parallel to each other along the length of the box-shaped member, and a cutout is formed at the lower portion of each of the two end walls of the box-shaped member extending parallel to each other.

5. A vacuum shield device as claimed in claim 1, wherein said pressing means includes a hose member receiving a pressure medium supplied thereto and pressing against said shield member.

6. A vacuum shield device as claimed in claim 5, therein said pressing means includes a keep member partially surrounding said hose member.

7. A vacuum shield device as claimed in claim 1, further comprising pressure control means for controlling the force with which said pressing means forces said shield member against the surface of the workpiece.

8. A vacuum shield device as claimed in claim 1, wherein said shield member is positioned between said pressing means and said surface of said workpiece.

* * * * *